(12) United States Patent
Han

(10) Patent No.: US 11,014,836 B2
(45) Date of Patent: May 25, 2021

(54) AUTONOMOUS BUBBLE GENERATING PLASMA UNIT FOR WATER TREATMENT

(71) Applicant: Ju Ho Han, Bucheon-si (KR)

(72) Inventor: Ju Ho Han, Bucheon-si (KR)

( * ) Notice: Subject to any disclaimer, the term of this patent is extended or adjusted under 35 U.S.C. 154(b) by 0 days.

(21) Appl. No.: 16/099,149

(22) PCT Filed: Jun. 24, 2016

(86) PCT No.: PCT/KR2016/006790
§ 371 (c)(1),
(2) Date: Nov. 5, 2018

(87) PCT Pub. No.: WO2017/222096
PCT Pub. Date: Dec. 28, 2017

(65) Prior Publication Data
US 2019/0127242 A1 May 2, 2019

(30) Foreign Application Priority Data
Jun. 22, 2016 (KR) .................. 10-2016-0077979

(51) Int. Cl.
*C02F 1/46* (2006.01)
*H05H 1/24* (2006.01)
(Continued)

(52) U.S. Cl.
CPC ............ *C02F 1/4608* (2013.01); *C02F 1/467* (2013.01); *C02F 1/48* (2013.01); *H01J 37/32183* (2013.01); *H05H 1/24* (2013.01)

(58) Field of Classification Search
CPC .......... C02F 1/4608; C02F 1/467; C02F 1/48; C02F 2103/008; C02F 2103/42;
(Continued)

(56) References Cited

U.S. PATENT DOCUMENTS

| 5,354,962 A | 10/1994 | Mizuno et al. |
| 5,585,766 A | 12/1996 | Shel |

(Continued)

FOREIGN PATENT DOCUMENTS

| JP | 2005-285397 | 10/2005 |
| JP | 2005-285397 A | 10/2005 |

(Continued)

*Primary Examiner* — Xiuyu Tai
(74) *Attorney, Agent, or Firm* — Maschoff Brennan

(57) ABSTRACT

The present invention is characterized in that an autonomous bubble generating plasma unit for water treatment comprises a first reactor and a second reactor. The first reactor comprises: a first reacting water duct in which a secondary coil is wound around a duct body having a predetermined length, wherein a static mixer is provided in the duct body; an insulating duct body of a predetermined length installed on the outside of the first reacting water duct excluding a region in which a resonance generating part provided on the outside of the secondary coil wound on the first reacting water duct; and the resonance generating part in which a primary coil is wound on a primary coil bobbin installed at a predetermined gap from the outside of the secondary coil located in a water introducing part of the first reacting water duct, and the number of windings of the primary coil wound on the primary coil bobbin is adjusted to be a resonance point by a winding number adjusting bobbin, wherein a motor drive is installed to rotate the winding number adjusting bobbin forward and in reverse, and thus the winding number adjusting bobbin is controlled by resonance information applied to the secondary coil from a resonance sensor. The second reactor comprises: a second reacting water duct connected to the first reacting water duct to receive a supply of treated water treated in the first reacting water duct, and provided as an insulating duct of a predetermined length; an internal electrode installed in the second reacting water duct and formed as a Kenics mixer-type structure; and an external (Continued)

electrode installed so as to not be conductive with the internal electrode and having a cylindrical mesh-type duct body.

11 Claims, 6 Drawing Sheets

(51) Int. Cl.
  *C02F 1/48* (2006.01)
  *C02F 1/467* (2006.01)
  *H01J 37/32* (2006.01)

(58) Field of Classification Search
  CPC . C02F 2303/04; H01J 37/32183; H01J 27/14; H05H 1/24; H05H 1/2406; H05H 1/54; H05H 2001/2412; H05H 2001/2431; A62D 3/19; A62D 2203/10; B01J 9/129; B01J 2219/0877; B01J 2219/0884; B01J 2219/0898; Y10S 588/90
  See application file for complete search history.

(56) References Cited

U.S. PATENT DOCUMENTS

| | | | |
|---|---|---|---|
| 6,485,602 | B2 | 11/2002 | Hirose |
| 7,253,572 | B2 | 8/2007 | Park et al. |
| 9,840,427 | B2 | 12/2017 | Kim et al. |
| 2017/0197849 | A1 | 7/2017 | Kim et al. |

FOREIGN PATENT DOCUMENTS

| | | |
|---|---|---|
| JP | 2015-018654 A | 1/2015 |
| KR | 10-2002-0011076 A | 2/2002 |
| KR | 10-0599094 B1 | 7/2006 |
| KR | 10-2014-0008781 A | 1/2014 |
| KR | 10-2014-0097763 A | 8/2014 |
| KR | 20-2015-0000005 U | 1/2015 |
| KR | 10-1605070 B1 | 3/2016 |

[FIG. 1]
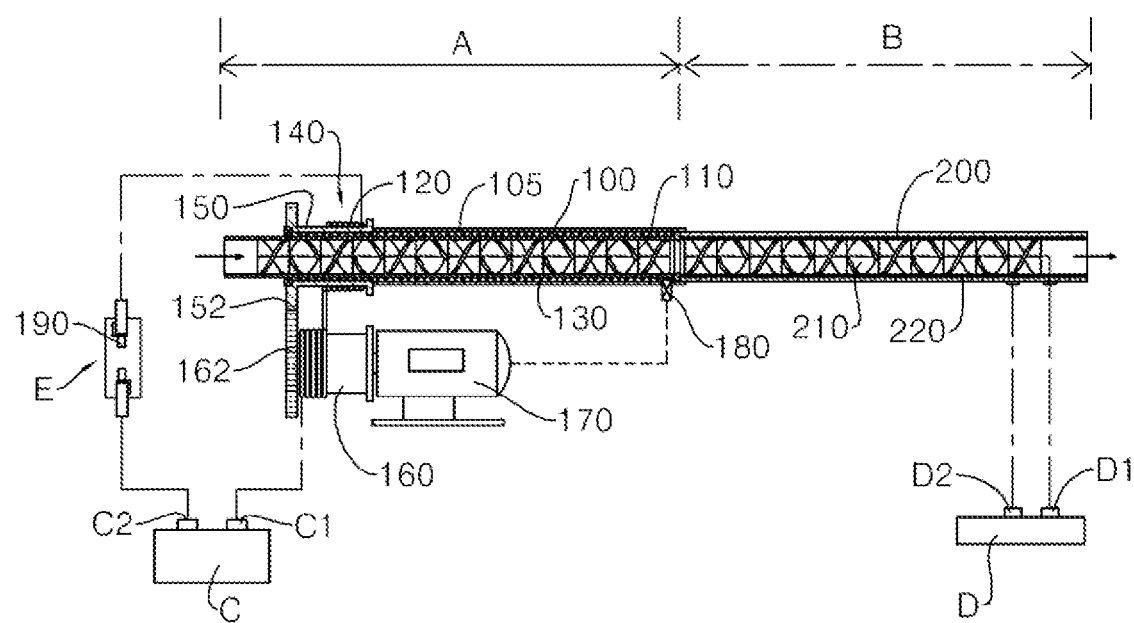

[FIG. 2]
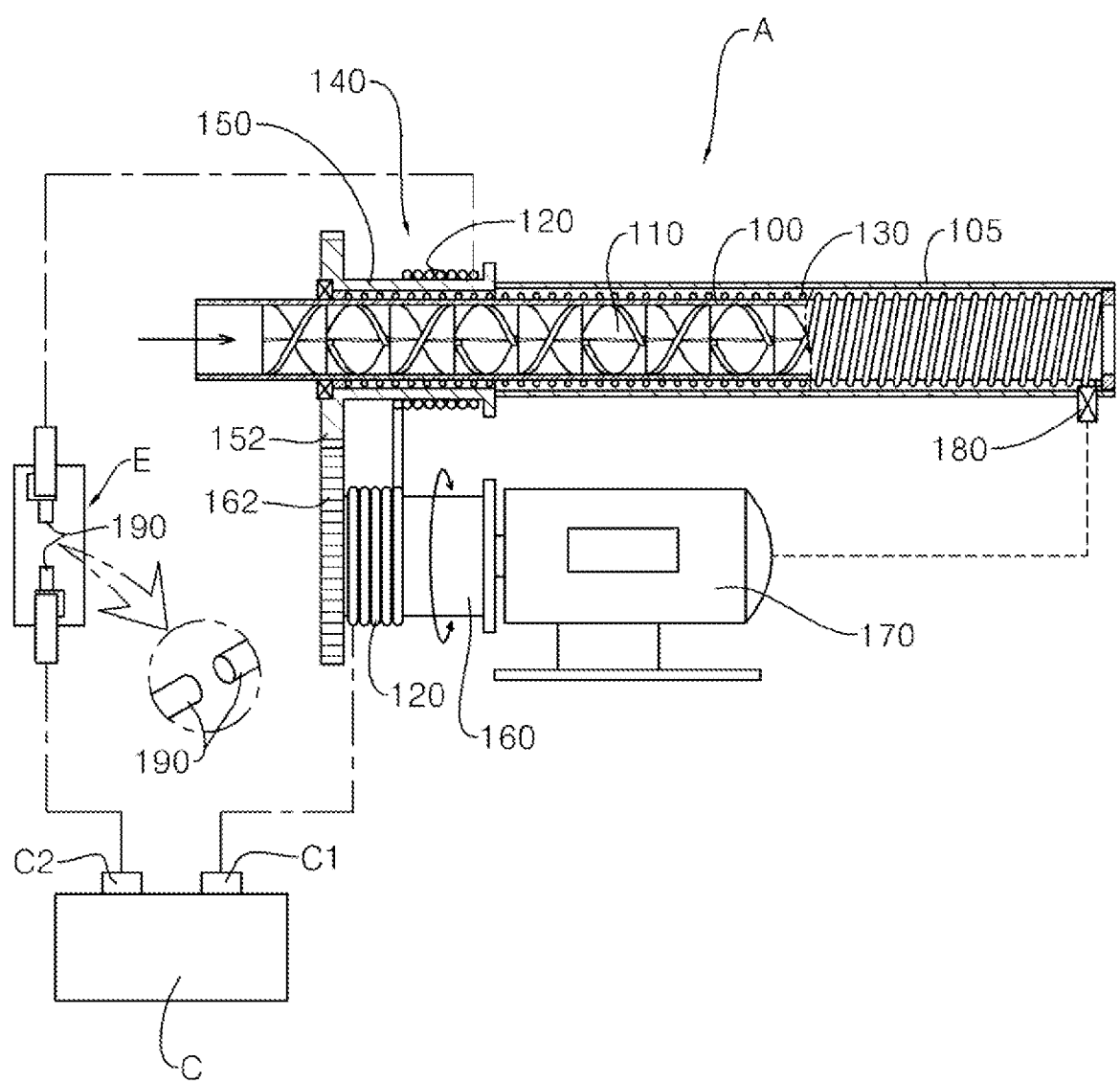

[FIG. 3]
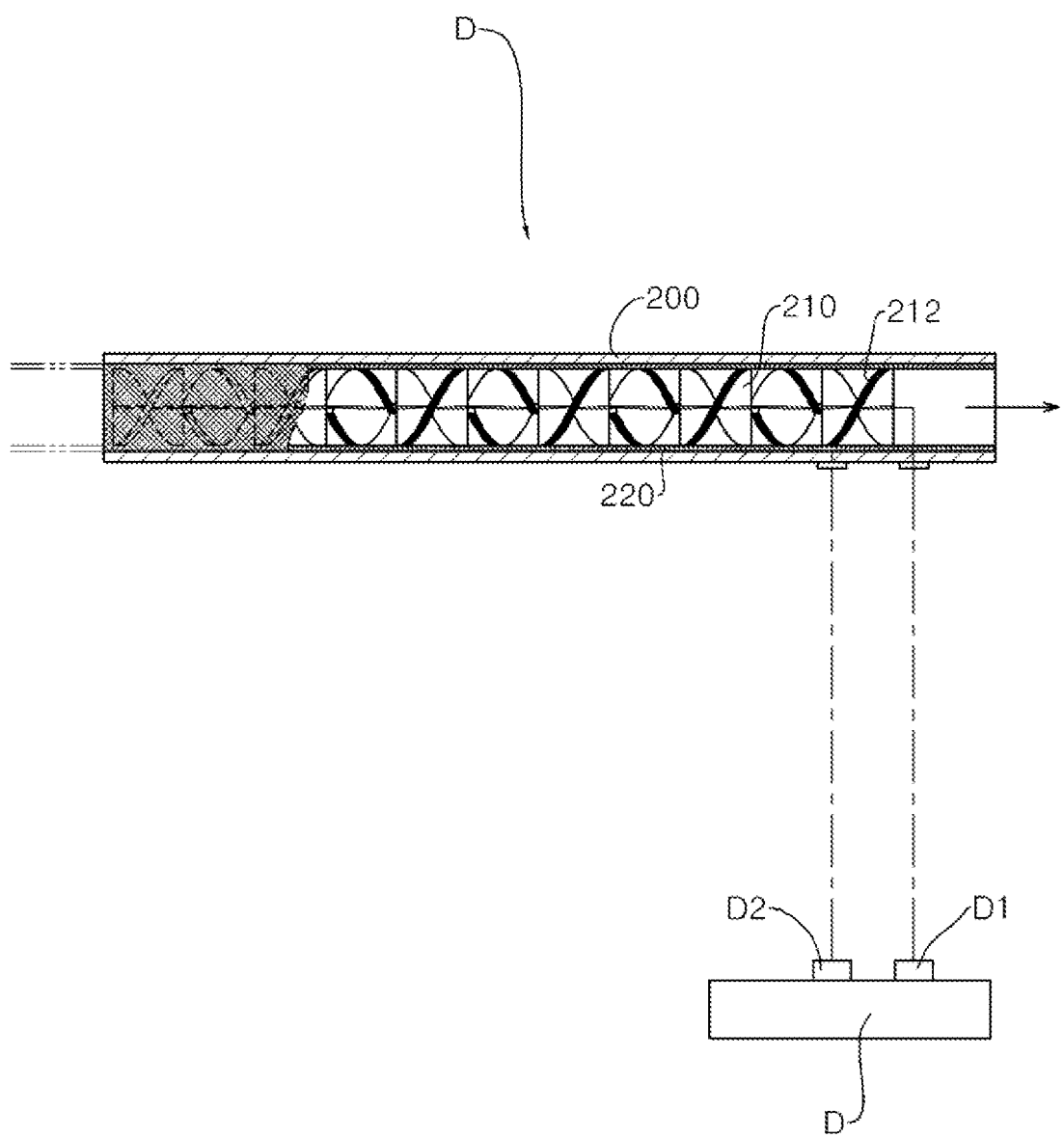

[FIG. 4]
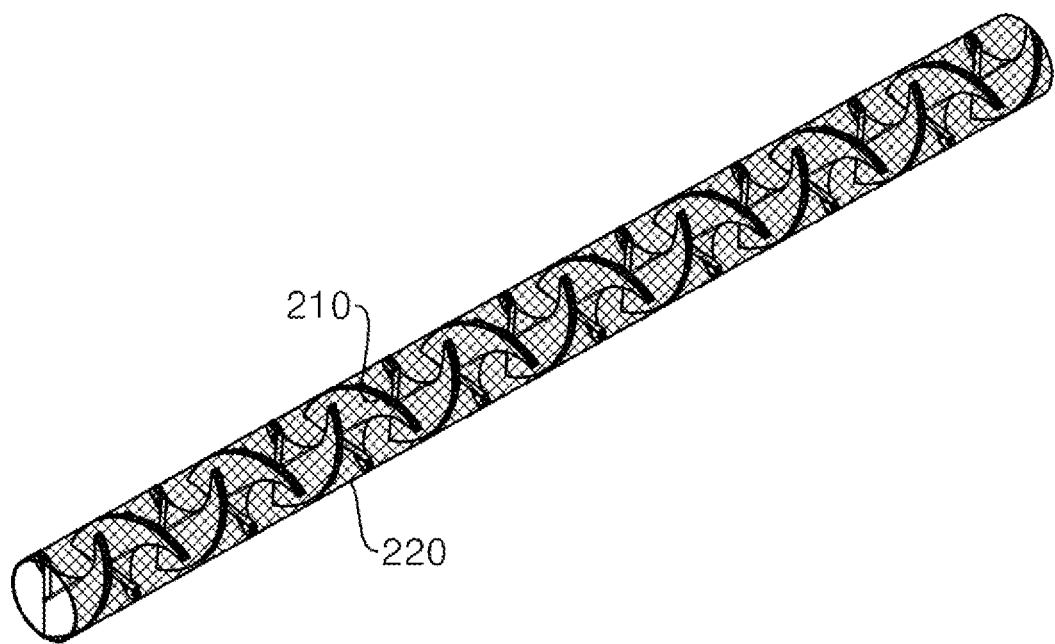

[FIG. 5]
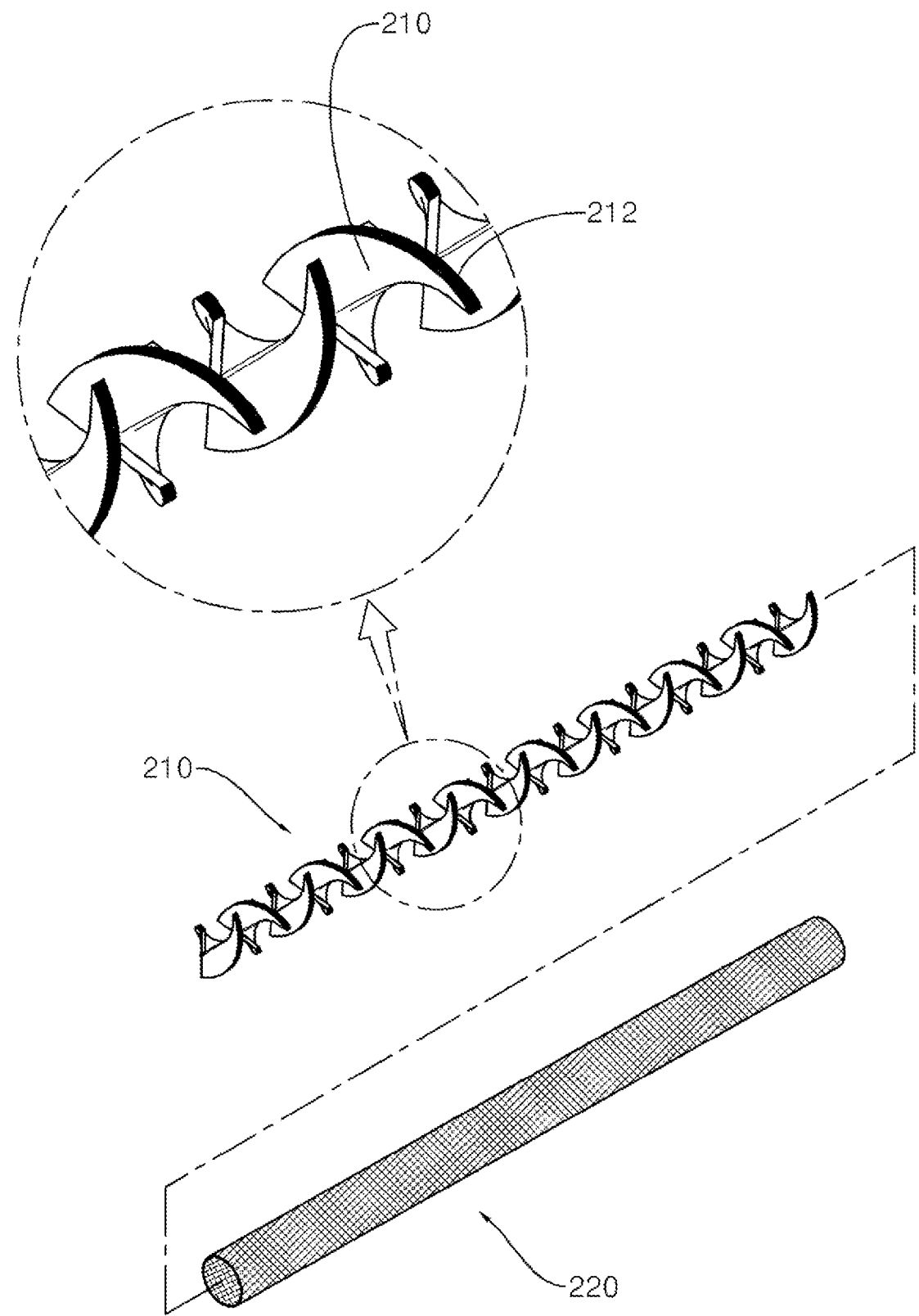

[FIG. 6]
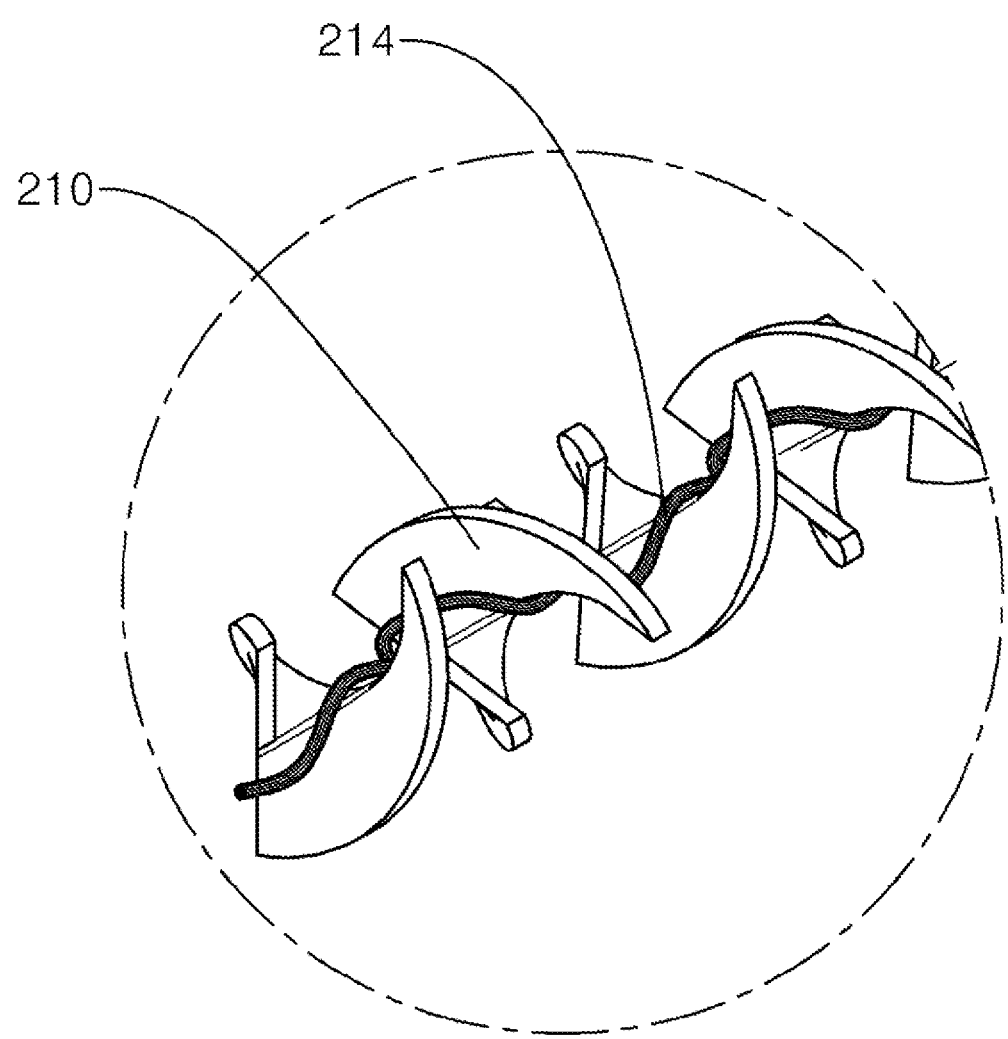

AUTONOMOUS BUBBLE GENERATING PLASMA UNIT FOR WATER TREATMENT

TECHNICAL FIELD

The present invention relates to an autonomous bubble generating plasma unit for water treatment and more specifically, to an autonomous bubble generating plasma unit for water treatment, which can easily connect to water course pipes that comply with domestic and international standards, can be used for a wide range of purposes and can largely improve efficiency in the treatment of water such as sterilization, washing and disinfection, and ionization etc.

DESCRIPTION OF THE RELATED ART

Plasma, which is one of the four states of matter and is different from light, had been found by scientists during an experiment with a discharge tube. Later, Irving Langmuir who was an American chemist and physicist found that a state similar to that of light is a state of matter, suggested calling the state the fourth state of matter, and started to use the term plasma that comes from a Greek word to describe the state.

Modern scientists started to investigate the transition from the three states of matter—solids, liquids, and gases—into the fourth state of matter—plasma, and expected that plasma would be used in various fields. During the Second World War, German scientists used plasma as a medium for dissociating materials generated in metabolism processes and performing an oxygen reduction reaction with the materials so as to supply oxygen into a transport airplane that could accommodate thousands of soldiers at one time, and the U.S. used plasma as a medium for causing confusion in recognition so as to protect its vessels from the attack of German submarines.

It has not yet been revealed whether plasma for military purposes was successful. However, since plasma was used in various industries, its historical theories and results have been unveiled. Energy different from thermal energy, used to change solids into liquids or change liquids into gases, is used to change gases into plasma. To date, it has been revealed that high-voltage electric energy is the optimum energy for the production of plasma. In addition to electric energy, pulse power is used to dissociate gases and change their phases. Further, electric energy with high voltage and low current is used to generate plasma.

The consumption of voltage and current vary depending on use.

However, when the deviation of voltage and current is small, high-temperature plasma is generated, while when the deviation of voltage and current is large, low-temperature plasma is generated. Further, a pulse is applied so as to generate plasma even under the voltage in which plasma starts to be generated. In this case, high frequency is usually used and temperature is determined depending on whether frequency is high or low. High-temperature plasma is generated at radio frequency (RF power) corresponding to megahertz (MHz) usually used as high frequency power for plasma, while low-temperature plasma is generated at radio frequency corresponding to kilohertz (kHz).

Plasma is largely divided into high-temperature plasma and low-temperature plasma depending on temperature. In addition to this classification, plasma has been divided depending on power for plasma, whether a reactor is opened and closed, types of reactors. High-temperature plasma has been used for melting and spraying metal, and low-temperature plasma has been under development so as to be used in fields related to things that must not be deformed or affected by heat.

Low-temperature plasma has been divided into corona discharge plasma, dark discharge plasma depending on the type of discharge and divided into glow plasma, gliding plasma, dusty plasma etc. depending on the color and type of light. Among them, glow plasma, gliding plasma, and corona plasma can cause reduction of gases or distortion in the location of an object that was shown during the Second World War.

Currently, plasma is mostly used for spraying, flat panel displays and used in the process of etching. Further, the process of plasma treatment is preferred to the process of chemical surface treatment as an environmentally friendly process.

In particular, plasma has attracted attention of the public as application technology as it is used in the process of discharging exhaust gases out of vehicles so as to reduce exhaust gas emissions, and in the process of discharging industrial fumes so as to protect the environment. Harmful gases discharged in the air due to the burning of fossil fuels have been causes behind costs of incinerating and discharging hazardous gases and secondary contamination while plasma helps reduce management costs and cause no secondary contamination.

Plasma is expected to be introduced in any types and to function in various ways in the field of atmospheric environment. However, some leading scientists and plasma engineers have taken a negative stance on the futuristic role of plasma in the field of water environment. This is because the state of plasma is changed from the state of gases and is made from a gas. However, California Institute of Technology succeeded in sterilizing food through the generation of water plasma. This has proved that plasma is also useful in the field of water environment. Accordingly, the establishment of theories of the generation and use of water plasma has started.

However, there are also problems with the generation and use of plasma in water. The problems are described as follows.

The first problem is thermal distortion. In this case, heat generated in the process of producing plasma in water raises the temperature of the water because the heat remains in the water.

The second problem is to make gases used for the production of plasma exist in water. Scientists and experts have a theory of generating plasma in water. According to the theory, bubbles are generated in water and gases in bubbles are used to product plasma. It is easy to generate bubbles in water. To this end, external air is inserted into water through a hose. However, the bubbles are not appropriate for gases used for the production of plasma in water. There are still the problems of the size of bubble in water, the stable maintenance of voltage between walls of the water and bubbles, and the reaction of water with organic substances in water while plasma is generated, proceeds and is removed simultaneously according to the cycle in which the bubbles are generated and burst.

The third problem relates to power and plasma electrodes. Plasma cannot be used in water by means of plasma power and electrodes used in the atmosphere. When plasma contacts water, plasma immediately disappears even in the case where a chamber such as a gas container is prepared for accommodating electrodes. Thus, only the outlet of the chamber reacts. That is, only a limited part of the chamber reacts. As a result, water treatment is impossible. In terms of the arrangement and property of an electrode, a part near an electrode only reacts with the plasma electrode used in in the atmosphere. Thus, a rapid reaction using a large amount of water is impossible.

DETAILED DESCRIPTION OF THE INVENTION

Technical Problems

The present invention is directed to providing an autonomous bubble generating plasma unit for water treatment which generates low-temperature plasma that does not raise water temperature, where a low-temperature plasma reaction takes place, which generates autonomous bubbles using a reaction as a means to solve the problems that are caused as a result of the insertion of external bubbles with a low reaction rate, which contributes to a plasma reaction, and which includes a durable electrode and structure fit for the environment in water.

Technical Solutions

The present invention is characterized in that an autonomous bubble generating plasma unit for water treatment includes a first reactor and a second reactor, the first reactor including a first reacting water duct in which a secondary coil is wound around a duct body having a predetermined length and which is provided with a static mixer in the duct body; an insulating duct body of a predetermined length installed on the outside of the first reacting water duct excluding a resonance generating part provided on the outside of the secondary coil wound on the first reacting water duct; and a resonance generating part in which a primary coil is wound on a primary coil bobbin installed at a predetermined gap from the outside of the secondary coil located in a water introducing part of the first reacting water duct, and the number of windings of the primary coil wound on the primary coil bobbin is adjusted to be a resonance point by a winding number adjusting bobbin, wherein a motor drive for forward and reverse rotations is installed at the winding number adjusting bobbin, and thus the winding number adjusting bobbin is controlled on the basis of resonance information applied to the secondary coil by a resonance sensor.

The second reactor comprises a second reacting water duct connected to the first reacting water duct to receive a supply of treated water treated in the first reacting water duct, and provided as an insulating duct of a predetermined length; an internal electrode installed in the second reacting water duct and formed as a Kenics mixer-type structure; and an external electrode installed so as to not be conductive with the internal electrode and having a cylindrical mesh-type duct body.

The present invention is characterized in that the first reacting water duct is provided as a quartz duct, and a static mixer installed in the first reacting water duct is configured as a Kenics mixer that is a nonconductor.

The present invention is characterized in that the winding number adjusting bobbin is installed in parallel with the primary coil bobbin on a lateral portion of the primary coil bobbin, and has a driving gear formed on one side thereof so as to be coupled to a linking gear formed at the primary coil bobbin and a motor drive configured to rotate a step motor in forward and reverse directions, and that resonance information of a resonance sensor installed on one side of the secondary coil is supplied to the motor drive such that the motor drive controls the number of windings of the primary coil of the primary coil bobbin.

The present invention is characterized in that the secondary coil consists of any one of wire of platinum, wire of platinum group alloys, wire of silver plated with platinum.

The present invention is characterized in that the starting point of the primary coil connects with the negative electrode of the first power supplying part, the end of the primary coil connects with a discharge part that is drawn from and connects with the positive electrode of the first power supplying part, the starting point of the secondary coil connects with and earths an inlet of the first reacting water duct, and the end of the secondary coil is connected and fixed to an outlet of the first reacting water duct so as to contact water passing through the first reacting water duct.

The present invention is characterized in that the discharge part is provided as a rod-type bipolar electrode.

The present invention is characterized in that the rod-type bipolar electrode consists of any one of a titanium base filming over with platinum group alloys in a thin layer, or doped with conductive diamond or carbon boron.

The present invention is characterized in that the internal electrode connects with the negative electrode of a second power supplying part, and the external electrode connects with the positive electrode of the second power supplying part.

The present invention is characterized in that the internal electrode installed inside the second reacting water duct is provided with an insulation layer on the surface of the outer edge of a Kenics mixer-type structure configured as a conductor.

The present invention is characterized in that the internal electrode installed inside the second reacting water duct has conductive wire connecting with the center of a Kenics mixer-type structure configured as a nonconductor.

Advantageous Effects

According to the present invention, a first reacting water duct of a first reactor is provided as a quartz duct, a primary coil wound on the outside of a secondary coil located in a water introducing part of the first reacting water duct is wound such that the number of windings of the primary coil is adjusted to be a resonance point on the basis of resonance information applied to the secondary coil thereby making it possible to induce the generation of optimum plasma in the first reactor. As a result, efficiency in water treatment is significantly improved.

Additionally, according to the present invention, provided is an autonomous bubble generating plasma unit for water treatment, in which a first reactor and a second reactor are externally insulated and integrally connected so as to easily connect with water course pipes that comply with domestic and international standards and to be used for a wide range of purposes.

BRIEF DESCRIPTION OF THE DRAWINGS

FIG. 1 is an exemplary view illustrating an entire configuration of an autonomous bubble generating plasma unit for water treatment according to the present invention.

FIG. 2 is an enlarged view illustrating a configuration of a first reactor in an autonomous bubble generating plasma unit for water treatment according to the present invention.

FIG. 3 is an enlarged view illustrating a configuration of a second reactor in an autonomous bubble generating plasma unit for water treatment according to the present invention.

FIG. 4 is a perspective view illustrating configurations of internal and external electrodes of a second reactor in an autonomous bubble generating plasma unit for water treatment according to the present invention.

FIG. 5 is an exploded perspective view illustrating configurations of internal and external electrodes of a second reactor in an autonomous bubble generating plasma unit for water treatment according to the present invention.

FIG. 6 is a perspective view illustrating another internal electrode of a second reactor in an autonomous bubble generating plasma unit for water treatment according to the present invention.

BEST MODE FOR CARRYING OUT THE INVENTION

Below, preferred embodiments of the present invention will be described in detail with reference to the attached drawings. In describing the present invention, detailed description of the well-known functions and configurations in relation to the present invention will be omitted if it is deemed to make the gist of the present invention unnecessarily vague. Below, preferred embodiments of the present invention will be described in detail with reference to the attached drawings.

The present invention is configured as a single unit for the purpose of water treatment such as the sterilization of water, the ionization of water, the removal of organic matter in water, the manufacture of disinfectant water, etc. To this end, the present invention largely includes a first reactor A, a second reactor B, and first and second power supplying parts C, D that can supply power the reactors respectively.

The first reactor A is formed at a water introducing part for water treatment and includes an insulating duct body 105, a first reacting water duct, a primary coil 120, a secondary coil 130, a resonance generating part 140, a winding number adjusting bobbin 160, a resonance sensor 180 and a static mixer 110.

The first reacting water duct 100 has a duct body which has a predetermined length, around which a secondary coil 130 is wound, and which has a static mixer 110 therein, and an insulating duct body 105 of a predetermined length is installed on the outside of the first reacting water duct 100 excluding a resonance generating part 140 provided on the outside of the secondary coil 130 wound around the first reacting water duct 100.

The insulating duct body 105 is configured to have the shape of a pipe having a predetermined length and is provided with an engaging means such as a flange or an engaging screw, etc. on both lateral ends thereof.

Preferably, the first reacting water duct 100 is provided as a quartz duct. This is because a quartz duct has permittivity and piezoelectricity high enough to form induced voltage and vibrates so as to maximize the generation of bubbles in water flowing inside the first reacting water duct when power of the first power supplying part C is supplied to the first reacting water duct. When bubbles are not generated, the starting point and end point of the secondary coil 130, where voltage is induced, are conductive by water, gases in the bubbles form a wall against water, and electrification does not take place between water and a bubble, and a bubble and a bubble. Thus, plasma is not generated.

Further, it is not proper to introduce bubbles generated by a bubble generator into water from the outside because the bubbles are not small in size, are not generated together with plasma and cannot generate a large amount of energy. Bubbles that are small, and generated and removed within a short period of time are most preferable. Such bubbles have to be generated and removed in a non-equilibrium state together with generation of plasma.

In this case, the process of an efficient reaction can be observed. Clear water turns milky. Then the milky water turns clear again six to ten minutes after power is blocked. Further, when the process of a reaction is observed through a transparent pipe, water in the pipe looks a bit purple as in the case where an object is located in a different position from its actual position. Bubbles introduced from the outside can be observed although the bubbles are very small. However, bubbles generated and removed in a non-equilibrium state together with plasma cannot be invisible to the naked eye, and only the change in the color of water can be observed. This is because such bubbles are extremely small, and generated and removed very fast. The generation, progress and removal of plasma are repeated too fast to be invisible to the naked eye. Thus, the plasma appears to last with the naked eye from the moment that the plasma is generated until power is blocked.

The present invention is configured to have a primary coil 120 and a secondary coil 130 that induces voltage so as to generate proper plasma and blocks avalanche voltage in water even in the case where power of different voltage and frequency are used in accordance with the use of water treatment. Thus, the present invention is configured differently from a usual way that multiplied voltage is induced and that a Tesla coil is configured.

A coil that is wound like a usual multiplied voltage-type coil or a Tesla coil cannot properly respond when the voltage and frequency of power are changed. This is because frequency figures often change under different circumstances although micro frequency is launched to power. Additionally, voltage also changes depending on a contacted object. For instance, even in the case of power of identical voltage and current, voltage figures change depending on the case where a load contacts sea water or water in a river or lake.

A plasma unit of the present invention can be used for a wide range of purposes in water treatment. This is because the voltage and frequency of power can be changed in accordance with the use of water treatment and the conditions for water treatment. For instance, although the diameter of a pipe is described as 20 mm, the voltage as 4 kV, and the frequency as 120 kHz, the numbers are not absolute ones. The numbers are provided only as examples to describe an embodiment of the present invention. As another example, suppose that a vehicle sprays water that underwent a reaction for sterilization while traveling through an area where foot and mouth disease has broken out. In this case, the voltage of 8 kV and the frequency of 200 kHz can be used for a faster reaction. As yet another example, a user can use a plasma unit of the present invention to circulate water in the fish tank and to sterilize a fish tank of a sushi restaurant, and fish and shellfishes in the fish tank by weakening the killing power and speed and by lowering the flow velocity. In this case, low-frequency power can be used. Power can be changed in accordance with the use and environment.

When the primary coil 120 and secondary coil 130 are already fixed, power cannot be changed. This is because proper electric charge that induces the generation of plasma cannot be generated unless the primary coil 20 agrees with the secondary coils 130. The balance of the primary and secondary coils, and the length of the line of the secondary coil 130 are important elements. If the line of the secondary coil is long like a Tesla coil, power output is delayed causing the generation of avalanche voltage. Due to avalanche voltage, unspecified high-voltage discharge happens in water. Thus, the cycle of plasma cannot be controlled quickly and precisely. A plasma cycle at which speed is stable is an important element that can widen a reaction area.

Further, if the progress and removal of plasma are not periodically repeated in a stable manner, and high voltage is output only in a certain area, an arc also happens in water, badly affects the conditions for generating plasma in water and raises the temperature of water. If avalanche voltage happens in the atmosphere, it becomes an arc, bumps into insulated air and is controlled, or is returned through an electrode and is controlled. If an arc happens in water by means of avalanche voltage, conduction is performed to water except the case where the water is pure and insulated. If the difference in conduction increases in water, current of power is rapidly consumed, and voltage drops. Due to the voltage drop, power is stopped. Thus, plasma cannot be continuously generated.

The secondary coil 130 is wound around the first reacting water duct 100 configured as a quartz duct. The primary coil 120 is wound around a primary coil bobbin 150 installed at a predetermined gap from the outside of the secondary coil 130 located at the resonance generating part 140, wherein resonance generates such that the number of the windings of the primary coil 120 wound around the primary coil bobbin 150 is adjusted by a winding number adjusting bobbin 160.

The winding number adjusting bobbin 160 is installed in parallel with the primary coil bobbin 150 on a lateral portion of the primary coil bobbin, and has a driving gear 162 formed on one side thereof so as to be coupled to a linking gear 152 formed at the primary coil bobbin 150. A motor drive 170 configured to rotate a step motor in forward and reverse directions is installed at the winding number adjusting bobbin 160, and resonance information of a resonance sensor 180 installed on one side of the secondary coil 130 is supplied to the motor drive 170 such that the motor drive 170 controls the number of the windings of the primary coil 120 of the primary coil bobbin 150.

For instance, in an early stage of the operation of a plasma unit, the primary coil 120, which is configured as a single line coil, is made of a soft material and has thickness ranging from 0.8 mm to 2 mm, is wound around the winding number adjusting bobbin 160 ten times or more. The windings of the primary coil 120 at the winding number adjusting bobbin 160 around the primary coil bobbin 150 is stopped according to the resonance information sent from the resonance sensor 180 installed at a position where the secondary coil 130 is wrapped in the process in which windings are performed around the primary coil bobbin 150 in the state where the primary coil 120 is not wound around the primary coil bobbin 150. That is, when the primary coil 120 agrees with the secondary coil 130 and a resonance point occurs, the resonance sensor 180 recognizes the resonance point and supplies resonance information to the motor drive 170, and the motor drive 170 controls the winding number adjusting bobbin 160 with the information sent from the resonance sensor 180 such that windings are performed until the number of windings of the primary coil 120 most appropriate for the primary coil bobbin 150 reaches the resonance point.

For instance, platinum wire whose diameter is 0.2 mm with respect to a quartz duct whose diameter is 20 mm can be used as the secondary coil 130 wound around the perimeter of the first reacting water duct 100 and wound about 300 times around the outer wall of the quartz duct within a length of 100 mm. In this case, the number of the windings of the secondary soil 130 is provided only as an example to describe an embodiment of the present invention and accords with power of 4 kV and 120 kHz that is to be supplied to the first reactor A. When the diameter of the first reacting water duct 100 becomes larger, the number of windings can increase. In the case of frequency deviation of up to 100 kHz, the number of the windings of the secondary coil 130 does not need to be added or deducted. This is because the winding number adjusting bobbin 160 around which the primary coil 120 is wound operates, controls the number of the windings of the primary coil 120 and agrees with the secondary coil 130. Platinum wire is useful as it has higher conductivity than copper wire thereby making it possible to reduce the number of the windings of the secondary coil 130 and as an end of the secondary coil 130 is introduced into water and insoluble. Pure platinum wire is very expensive. Thus, wire of platinum group alloys, or wire of silver plated with titanium, which has low solubility and high conductivity as an alternative to platinum, is preferably used as the secondary coil.

Further, when the diameter of the first reacting water duct 100 configured as a quartz duct becomes larger, the length of the first reacting water duct 100 also becomes longer. Thus, voltage preferably needs to increase. However, excessively high voltage and frequency cause avalanche voltage to a secondary voltage inducing pat, and even voltage cannot be induced. Conversely, in the case of excessively low voltage and frequency, even voltage also cannot be induced, and the vibration of the quartz duct cannot be triggered. The voltage of 6 kV and the output frequency of 180 kHz are appropriated for a quartz duct with a diameter of 100 mm, and the voltage of 8 kV and the output frequency of 240 kHz are appropriated for a quartz duct with a diameter of 200 mm. Usually, DC output power is used for generating low-temperature plasma in the atmosphere. However, AC output power also can be used according to the present invention.

Further, the insulation of the secondary coil 130 consists of synthetic resins and is located inside the insulating duct body 105 so as to prevent external discharge in the middle of the line of the secondary coil 130. This is because discharge can occur although insulation is done if a sharp conductor such as a knife is located nearby in the case of high voltage.

The starting point of the primary coil 120 has a connecting point so as to connect with the negative electrode C1 of the first power supplying part C, and the end of the primary coil 120 has a connecting point so as to connect with a discharge part E that is drawn from and connects with the positive electrode C2 of the first power supplying part C.

Preferably, the discharge part E is provided as a rod-type bipolar electrode 190, not a needle-type electrode that is a usual discharge electrode of low-temperature plasma, etc. and consists of a heat resistant material with high conductivity. A titanium base filming over with platinum group alloy in a thin layer, or doped with conductive diamond or carbon boron can have the best quality of efficiency and durability.

A usual plasma discharge electrode is provided as a single needle-type electrode having a sharp point, or a plurality of needle-type electrodes having a sharp point, etc. Such electrodes are preferred as voltage is easily discharged through the sharp point. When the reaction areas of a rod-type bipolar electrode 190 in the present invention and many usual plasma discharge electrodes are applied under the same power supply condition, the reaction area of the rod-type bipolar electrode 190 is bigger than that of a usual plasma discharge electrode. This is because the rod-type bipolar electrode 190 outputs voltage easily like the needle-type electrode at any round angular corner and tolerates the speed at which voltage is output. Only with frequency corresponding to kHz, frequency is launched and proceeds so fast that people cannot feel. Electrodes enough to output high-speed voltage immediately and maintain the same are needed so as to continue discharge in a stable manner as this frequency is involved in the speed at which voltage is output.

If electrodes cannot accommodate the speed at which voltage is output, voltage is delayed thereby degrading and melting the electrodes, and high-temperature volume leads to a reduction in the lifespan of the electrodes. All plasma starts with discharge. This is why an explanation has been provided.

A rod-type bipolar electrode 190 is not directly configured as a plasma electrode in water in the present invention but is an important element for efficiently generating plasma in water. The rod-type bipolar electrode 190 is a requisite for raising the voltage supplied by the first power supplying part C through the secondary coil 130 and for generating micro dusty plasma together with micro bubbles through the first reactor A. If the rod-type bipolar electrode 190 is easily melted, or cannot accommodate the speed of the voltage supplied by power and then discharges electricity in an unstable manner, relevant induced voltage, or relevant generation of bubbles and dusty plasma are also unstable. Thus, the completeness of the device cannot be achieved. In the case of low-temperature plasma, the temperature at the center of the low-temperature plasma is high enough to melt metal while the temperature of a portion that contacts the human body and a reaction area is low. The electrode of a dark discharge-type low-temperature plasma too weak to be visible to the eyes is in fact melted.

In the case of a usual device for generating low-temperature plasma, a cycle in which an electrode is replaced is shorter than a cycle in which power is replaced. This is because the temperature at the center of low-temperature plasma is high enough to melt an electrode quickly, the speed at which voltage is output cannot be accommodated, and power output is delayed. This is why a plurality of electrodes or a cylinder-type electrode is arranged in the case of low-temperature plasma so as to distribute and push voltage immediately when frequency is high. When electrodes for power output are short despite the speed at which voltage is pushed fast, a load generates heat at power or a line, and the lifespan of an electrode and a device is reduced. The power of high-voltage and high-speed plasma cannot be distributed to different positions and flow like current. Rather, the power of high-voltage and high-speed plasma is discharged at a nearby position at a time at a nearby position. Like the cycle in which electrodes are replaced, when electrodes are damaged earlier than expected and lines are degraded, the electrodes and lines are easily replaced in a reactor in the atmosphere. However, much time and effort have to be spent on replacement in water.

A unit of the present invention has to be designed to have a lifespan as long as that of the reactor and the unit, and the electrode of the unit has to be designed not to be replaced considering the unit of the present invention can be installed in water or in a watercourse as much time is spent on disassembling the unit in water. Thus, a rod-type bipolar electrode 190 is an important element.

That is, an experiment in which 96-hour continuous discharge was performed with respect to a usual plasma needle-type discharge electrode and a rod-type bipolar electrode 190 applied to the discharge part E of the present invention. As a result of the experiment, there is a huge difference in the time of degradation and the degree to which an electrode is melted. Eight needle-type electrodes were all degraded ten hours later, causing voltage to drop, and were melted after 30-hour continuous use making the electrodes inefficient, while the rod-type bipolar electrode 190 applied to the present invention did not cause voltage to drop, continued to operate, and had no resistance to the extent that the rod-type bipolar electrode was not melted, even after 96-hour continuous use. Thus, the rod-type bipolar electrode is appropriate for the use of water treatment plasma.

The starting point of the secondary coil 130 located at the inlet of the first reacting water duct (100) has a spiral part where a covering part is removed, and the spiral part earths and connects with the inlet of the first reacting water duct. The end of the secondary coil 130 located at an outlet of the first reacting water duct 100 has a spiral part where a covering part is removed, and the spiral part connects with water passing through the first reacting water duct 100. By doing so, electric charge is delivered to a wall between a bubble and a bubble, between a bubble and water generated inside the first reacting water duct 100 such that micro dusty plasma flies while proceeding and disappearing repeatedly in the direction of the flow velocity of water. A static mixer 110 configured as a nonconductor Kenics mixer is adopted so as to stimulate such movement inside the first reacting water duct 100 and increase a collision between a bubble and a bubble, between a bubble and a water particle. Even when escaping from the first reacting water duct 100, the flying dusty plasma remains in water and passes a second reacting water duct 200 of the second reactor B so as to decompose and ionize organic matter in water.

The second reactor B is provided with a second reacting water duct 200, an internal electrode 210 and an external electrode 220, and is formed on a travel path of the first reactor A.

The second reacting water duct 200 connects with the first reacting water duct 100 and is provided as an insulating duct that has a certain length and receives treated water treated in the first reacting water duct 100. An engaging means such as a flange or an engaging screw etc. is provided at both lateral ends of the second reacting water duct 200.

The internal electrode 210, as illustrated in FIGS. 4 and 5, is provided with an insulation layer 212 consisting of an insulation material on the surface of the outer edge of a Kenics mixer-type structure configured as a conductor so as to block conduction with the external electrode 220, or conductive wire 214, as illustrated in FIG. 6, connects with the center of a Kenics mixer-type structure configured as a nonconductor. A power line of the internal electrode 210 inside the second reacting water duct 200 is drawn outwards and connects with the negative electrode D1 of the second power supplying part D configured as a device for a DC pulse constant current.

The external electrode 220 is configured as an insoluble electrode material and as a cylindrical mesh-type duct body that accommodates the internal electrode 210 such that a power line is drawn from the inside of the second reacting water duct 200 to the outside of the second reacting water duct 200 and connects with the positive electrode D2 of the second power supplying part D.

Alternating current (AC) cannot be used for the second reactor B because the power of the second reactor B is different from that of the first reactor A. Unlike the power of the first reactor A, low-voltage and high-current power, for instance, output voltage between 5 V and 24 V DC, is appropriate for the second reactor. The second reactor is preferably configured to control current. Frequency ranging from 1 kHz to 50 kHz is appropriate for the second reactor. Preferably, 300 W electric power is consumed with respect to a pipe that has a diameter of 20 mm and treats six tons of water per hour so as to perform decomposition and ionization of organic matter in water as a post treatment.

In this case, the flow of current leads to the flow of voltage while the flow of voltage does not lead to the flow of current. Additionally, current is adjusted according to the increase and decrease in the diameter of the second reacting water duct 200 and in the amount treated by the second reacting water duct. This is because current contributes to the separation of ionized materials. Provided is an autonomous bubble generating plasma unit for water treatment, in which the first reactor (A) and second reactor (B) with the above-described configuration are externally insulated and integrally connected so as to easily connect with water course pipes that comply with domestic and international standards and to be used for a wide range of purposes.

The present invention can significantly improve efficiency in treatment such as the sterilization, washing and disinfection, ionization etc. of water and therefore can be applied to the treatment of water in a fish farm, the sterilization of cooling water in a cooling tank, the washing and sterilization of food and dishes without heat etc. thereby performing high-level sterilization and treating a large amount of water.

The present invention has been described with reference to the above-described embodiments. However, the present invention can be modified in various forms without departing from the technical scope of the present invention.

The invention claimed is:

1. An autonomous bubble generating plasma unit for water treatment comprising:
a first reactor and a second reactor,
wherein the first reactor comprises
a first reacting water duct in which a secondary coil is wound around a duct body having a predetermined length and which is provided with a static mixer in the duct body;
an insulating duct body of a predetermined length installed on the outside of the first reacting water duct excluding a resonance generating part provided on the outside of the secondary coil wound on the first reacting water duct; and
the resonance generating part in which a primary coil is wound on a primary coil bobbin installed at a predetermined gap from the outside of the secondary coil located in a water introducing part of the first reacting water duct, and the number of windings of the primary coil wound on the primary coil bobbin is adjusted to be a resonance point by the winding number adjusting bobbin, wherein a motor drive for forward, and reverse rotations is installed at the winding number adjusting bobbin, and thus the winding number adjusting bobbin is controlled on the basis of resonance information applied to the secondary coil by a resonance sensor,
wherein the second reactor comprises
a second reacting water duct connected to the first reacting water duct to receive a supply of treated water treated in the first reacting water duct, and provided as an insulating duct of a predetermined length;
an internal electrode installed in the second reacting water duct and formed as a Kenics mixer-type structure; and
an external electrode installed so as not to be conductive with the internal electrode and having a cylindrical mesh-type duct body.

2. The autonomous bubble generating plasma unit for water treatment according to claim 1, wherein the first reacting water duct is configured as a quartz duct.

3. The autonomous bubble generating plasma unit for water treatment according to claim 1, wherein the static mixer installed in the first reacting water duct is configured as a Kenics mixer that is a nonconductor.

4. The autonomous bubble generating plasma unit for water treatment according to claim 1, wherein the winding number adjusting bobbin is installed in parallel with the primary coil bobbin on a lateral portion of the primary coil bobbin, and has a driving gear formed on one side thereof so as to be coupled to a linking gear formed at the primary coil bobbin and the motor drive configured to rotate a step motor in forward and reverse directions, and resonance information of the resonance sensor installed on one side of the secondary coil is supplied to the motor drive such that the motor drive controls the number of windings of the primary coil of the primary coil bobbin.

5. The autonomous bubble generating plasma unit for water treatment according to claim 1, wherein the secondary coil consists of any one of wire of platinum, wire of platinum group alloys, wire of silver plated with platinum.

6. The autonomous babble generating plasma unit for water treatment according to claim 1, wherein a starting point of the primary coil connects with a negative electrode of a first power supplying part, an end of the primary coil connects with a discharge part that is drawn from and connects with a positive electrode of the first power supplying part, a starting point of a secondary coil connects with and earths an inlet of the first reacting water duct, and an end of the secondary coil is connected and fixed to an outlet of the first reacting water duct so as to contact waiter passing through the first reacting water duct.

7. The autonomous bubble generating plasma unit for water treatment according to claim 6, wherein the discharge part is configured as a rod-type bipolar electrode.

8. The autonomous bubble generating plasma unit for water treatment according' to claim 7, wherein the rod-type bipolar electrode consists of any one of a titanium base filming over with platinum group alloys in a thin layer, or doped with conductive diamond or carbon boron.

9. The autonomous bubble generating plasma unit for water treatment according to claim 1, wherein the internal electrode connects with a negative electrode of a second power supplying part, and the external electrode connects with a positive electrode of the second power supplying part.

10. The autonomous bubble generating plasma unit for water treatment according to claim 1, wherein the internal electrode installed inside the second reacting water duct is provided with an insulation layer on a surface of an outer edge of the Kenics mixer-type structure configured as a conductor.

11. The autonomous bubble generating plasma unit for water treatment according to claim 1, wherein the internal electrode installed inside the second reacting water duct has conductive wire connecting with the center of the Kenics mixer-type structure configured as a nonconductor.

* * * * *